US009391212B2

United States Patent
Choi

(10) Patent No.: US 9,391,212 B2
(45) Date of Patent: Jul. 12, 2016

(54) THIN FILM TRANSISTOR ARRAY PANEL AND ORGANIC LIGHT EMITTING DIODE DISPLAY INCLUDING THE SAME

(71) Applicant: SAMSUNG DISPLAY CO., LTD., Yongin, Gyeonggi-do (KR)

(72) Inventor: Chaun-Gi Choi, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/055,253

(22) Filed: Oct. 16, 2013

(65) Prior Publication Data

US 2014/0103317 A1 Apr. 17, 2014

(30) Foreign Application Priority Data

Oct. 17, 2012 (KR) ........................ 10-2012-0115358

(51) Int. Cl.
*H01L 29/786* (2006.01)
*H01L 27/32* (2006.01)
*G02F 1/1362* (2006.01)
*H01L 27/12* (2006.01)

(52) U.S. Cl.
CPC ...... *H01L 29/78693* (2013.01); *G02F 1/13624* (2013.01); *G02F 1/136213* (2013.01); *H01L 27/124* (2013.01); *H01L 27/1225* (2013.01); *H01L 27/1255* (2013.01); *H01L 27/3244* (2013.01)

(58) Field of Classification Search
CPC ..................... H01L 27/1225; G02F 1/136213; G02F 1/13624; G09G 3/3659
See application file for complete search history.

(56) References Cited

U.S. PATENT DOCUMENTS

| 6,891,196 B2* | 5/2005 | Tanaka et al. ................... 257/72 |
| 7,227,181 B2* | 6/2007 | Hwang .............. H01L 27/3276 257/40 |
| 7,576,354 B2* | 8/2009 | Son et al. ........................ 257/40 |
| 8,237,162 B2* | 8/2012 | Arai ................................ 257/59 |
| 2008/0246403 A1* | 10/2008 | Sagawa et al. .................. 315/35 |
| 2010/0032664 A1* | 2/2010 | Lee et al. ........................ 257/43 |
| 2010/0084652 A1* | 4/2010 | Yamazaki ........... H01L 27/1225 257/43 |
| 2010/0200858 A1* | 8/2010 | Toyota ................ H01L 27/1214 257/59 |

FOREIGN PATENT DOCUMENTS

| JP | 2006-186319 A | 7/2006 |
| KR | 10-2009-0085231 A | 8/2009 |
| KR | 10-2009-0105561 A | 10/2009 |
| KR | 10-1015850 B1 | 2/2011 |

* cited by examiner

*Primary Examiner* — Bryan Junge
(74) *Attorney, Agent, or Firm* — Robert E. Bushnell, Esq.

(57) ABSTRACT

A thin film transistor substrate according to an exemplary embodiment includes: a substrate; a gate electrode disposed on the substrate; a gate insulating layer disposed on the gate electrode; an oxide semiconductor disposed on the gate insulating layer; a first interlayer insulating layer disposed on the oxide semiconductor; a data line disposed on the first interlayer insulating layer; a second interlayer insulating layer disposed on the data line; a source electrode disposed on the second interlayer insulating layer and connected with the oxide semiconductor and the data line through a first contact hole through the second interlayer insulating layer; and a drain electrode disposed on the second interlayer insulating layer and connected with the semiconductor through a second contact hole through the second interlayer insulating layer.

7 Claims, 6 Drawing Sheets

THIN FILM TRANSISTOR ARRAY PANEL AND ORGANIC LIGHT EMITTING DIODE DISPLAY INCLUDING THE SAME

CLAIM OF PRIORITY

This application makes reference to, incorporates the same herein, and claims all benefits accruing under 35 U.S.C. §119 from an application for THIN FILM TRANSISTOR ARRAY PANEL AND ORGANIC LIGHT EMITTING DIODE DISPLAY INCLUDING THE SAME earlier filed in the Korean Intellectual Property Office on 17 Oct. 2012 and there duly assigned Serial No. 10-2012-0115358.

BACKGROUND OF THE INVENTION

1. Field of the Invention

The described technology relates generally to a thin film transistor substrate and an organic light emitting diode (OLED) display including the same.

2. Description of the Related Art

A thin film transistor (TFT) array has been used in various electronic devices such as flat panel displays. For example, the thin film transistor is used as a switch or a driving element in a flat display device such as a liquid crystal display (LCD), an organic light emitting diode display (OLED display), an electrophoretic display, and the like.

The thin film transistor includes a gate electrode connected to a gate line transmitting a scan signal, a source electrode connected to a data line transmitting a signal to be applied to a pixel electrode, a drain electrode facing the source electrode, and a semiconductor electrically connected with the source electrode and the drain electrode.

The semiconductor is an element important for defining the characteristics of the thin film transistor. As such a semiconductor, silicon (Si) has been most frequently used. Silicon is classified as one of amorphous silicon and polysilicon according to its crystalline shape. Amorphous silicon is limited in its use for the manufacture of high-performance elements because, while the associated manufacturing process is simple, charge mobility in the material is low. The use of polysilicon allows for high charge mobility, but the associated manufacturing process has some complexity and a high cost because crystallizing the silicon is required.

In order to complement the use of amorphous silicon and polysilicon as options for the manufacture of high-performance elements, a search has been conducted for a thin film transistor semiconductor that is an oxide semiconductor, has high electron mobility, exhibits a high on/off ratio of current in associated devices as compared with amorphous silicon, has low cost and has high uniformity as compared with polysilicon.

In addition, finding a method for improving current flow efficiency by forming connecting wiring using a metal having low resistivity has been very important here.

However, when the thickness of the metal wiring is increased to form low-resistive wiring, an undercut occurs due to skew during wet-etching. The undercut reduces current flow in the wiring; the size of the wiring can be increased by as much as the amount of the undercut in order to compensate, but the size of the transistor is then increased correspondingly.

As described below, when the size of the transistor is increased, parasitic capacitance is increased. To deal with this, capacitance of the capacitor in the circuit should be proportionally increased, and this is accomplished by increasing the area of the capacitor.

Further, as described below, when the size of the transistor is increased and the area of the capacitor is increased, the aperture ratio of the pixels is decreased.

The above information disclosed in this Background section is only for enhancement of understanding of the background of the described technology and therefore it may contain information that does not form the prior art that is known to a person of ordinary skill in the art.

SUMMARY OF THE INVENTION

In view of the above limitations, the present invention provides a thin film transistor substrate for which the aperture ratio of the pixels of a corresponding display device is increased by reducing the size of oxide semiconductor transistors comprising the thin film transistor substrate without deteriorating the operating characteristics of the transistors and an organic light emitting diode (OLED) display including the same.

In addition, the present invention provides a thin film transistor substrate that can, relative to silicon and polysilicon thin film transistor substrates, increase capacitance of a capacitor without increasing the area of the capacitor, and an OLED display including the same.

A thin film transistor substrate according to an exemplary embodiment includes: a substrate; a gate electrode disposed on the substrate; a gate insulating layer disposed on the gate electrode; an oxide semiconductor disposed on the gate insulating layer; a first interlayer insulating layer disposed on the oxide semiconductor; a data line disposed on the first interlayer insulating layer; a second interlayer insulating layer disposed on the data line; a source electrode disposed on the second interlayer insulating layer and connected with the oxide semiconductor and the data line through a first contact hole of the second interlayer insulating layer; and a drain electrode disposed on the second interlayer insulating layer and connected with the semiconductor through a second contact hole of the second interlayer insulating layer.

The thin film transistor substrate further includes a pixel electrode disposed on the second interlayer insulating layer, and the pixel electrode may be integrally formed with the drain electrode.

The source electrode, the drain electrode, and the pixel electrode may be formed of a transparent conductive material.

The source electrode, the drain electrode, and the pixel electrode may be made of at least one of indium tin oxide (ITO) and indium zinc oxide (IZO).

The source electrode, the drain electrode, and the pixel electrode may be thinner than the data line.

An OLED display according to an exemplary embodiment may include: a substrate; a first signal line disposed on the substrate; second and third signal lines crossing the first signal line; a first transistor connected with the first and second signal lines; a second transistor connected with the first transistor and the third signal line; and an organic light emitting element connected with the second transistor, and source electrodes and drain electrodes of the first and second transistors and a first electrode of the organic light emitting element connected with the second transistor may be formed on the same layer with the same material.

A source electrode and a drain electrode of at least one of the first and second transistors and the first electrode of the organic light emitting element connected with the second transistor may be formed of a transparent conductive material.

The source electrodes and the drain electrodes of the first and second transistors may be thinner than the second and third signal lines.

The transparent conductive material may include at least one of ITO and IZO.

The OLED display may further include an interlayer insulating layer disposed on the second and third signal lines, and a source electrode and a drain electrode of at least one of the first and second transistors and the first electrode of the organic light emitting element connected with the second transistor may be disposed on the interlayer insulating layer.

The source electrode of the first transistor may be connected with the second signal line through a first contact hole of the interlayer insulating layer, and the source electrode of the second transistor may be connected with the third signal line through a second contact hole of the interlayer insulating layer.

The second signal line may be a data line to which a data signal is applied and the third signal line may be a common power line to which a constant voltage is applied.

The OLED display may further include a capacitor formed of a first capacitor conductor disposed on the substrate, a gate insulating layer disposed on the first capacitor conductor, a first interlayer insulating layer disposed on the gate insulating layer, a second capacitor conductor disposed on the first interlayer insulating layer, a second interlayer insulating layer disposed on the second capacitor conductor, and a third capacitor conductor disposed on the second interlayer insulating layer.

The first conductor may be formed of the same material as the first signal line, the second conductor may be formed of the same material as the second and third signal lines, and the third capacitor conductor may be formed of the same material as the first electrode.

The first conductor may be electrically connected with the third capacitor conductor through a third contact hole formed through the gate insulating layer, the first interlayer insulating layer, and the second interlayer insulating layer.

According to the exemplary embodiments, a thin film transistor for which the size can be reduced without deteriorating the electrical characteristics of the thin film transistor and a corresponding thin film transistor substrate are provided.

BRIEF DESCRIPTION OF THE DRAWINGS

The above and other features and advantages of the present invention will be made more apparent by describing in detail exemplary embodiments thereof with reference to the attached drawings in which.

DETAILED DESCRIPTION OF THE INVENTION

Figure 1:
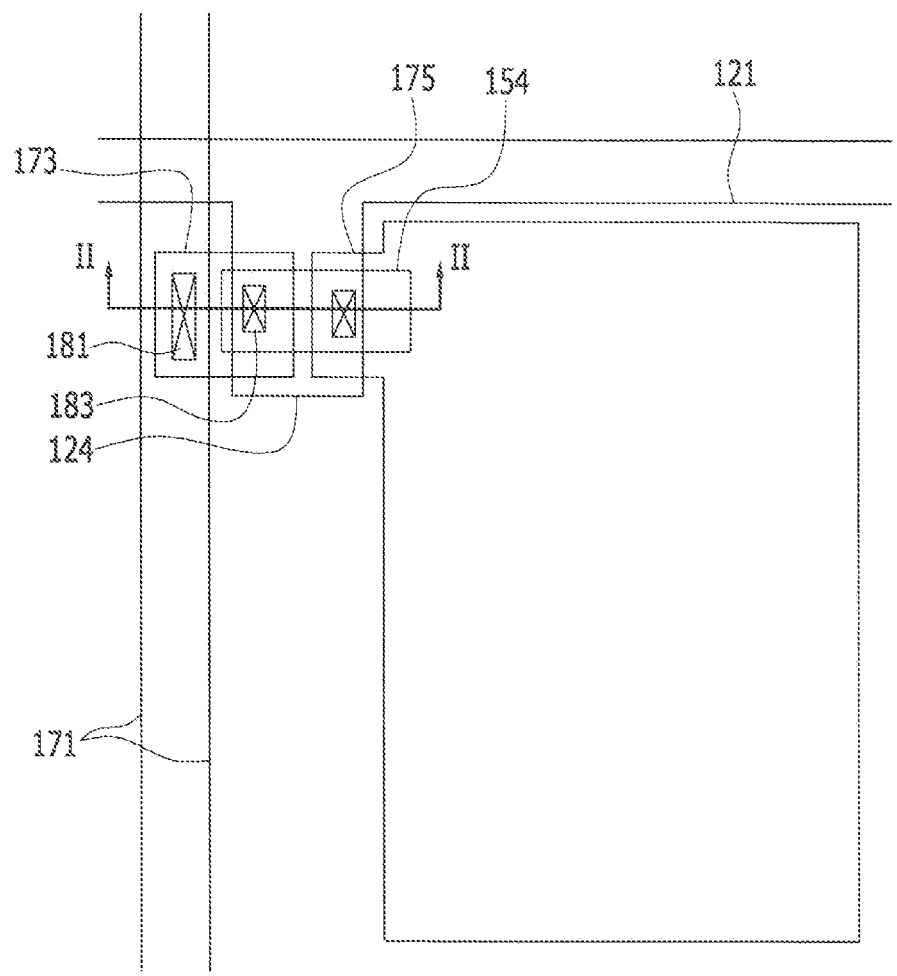
FIG. 1 is a layout view of a thin film transistor substrate according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element, but intervening elements may also be present. In contrast, when an element is referred to as being "directly on" another element, there are no intervening elements present.

First, referring to FIG. 1, a thin film transistor substrate according to an exemplary embodiment will be described.

Figure 2:
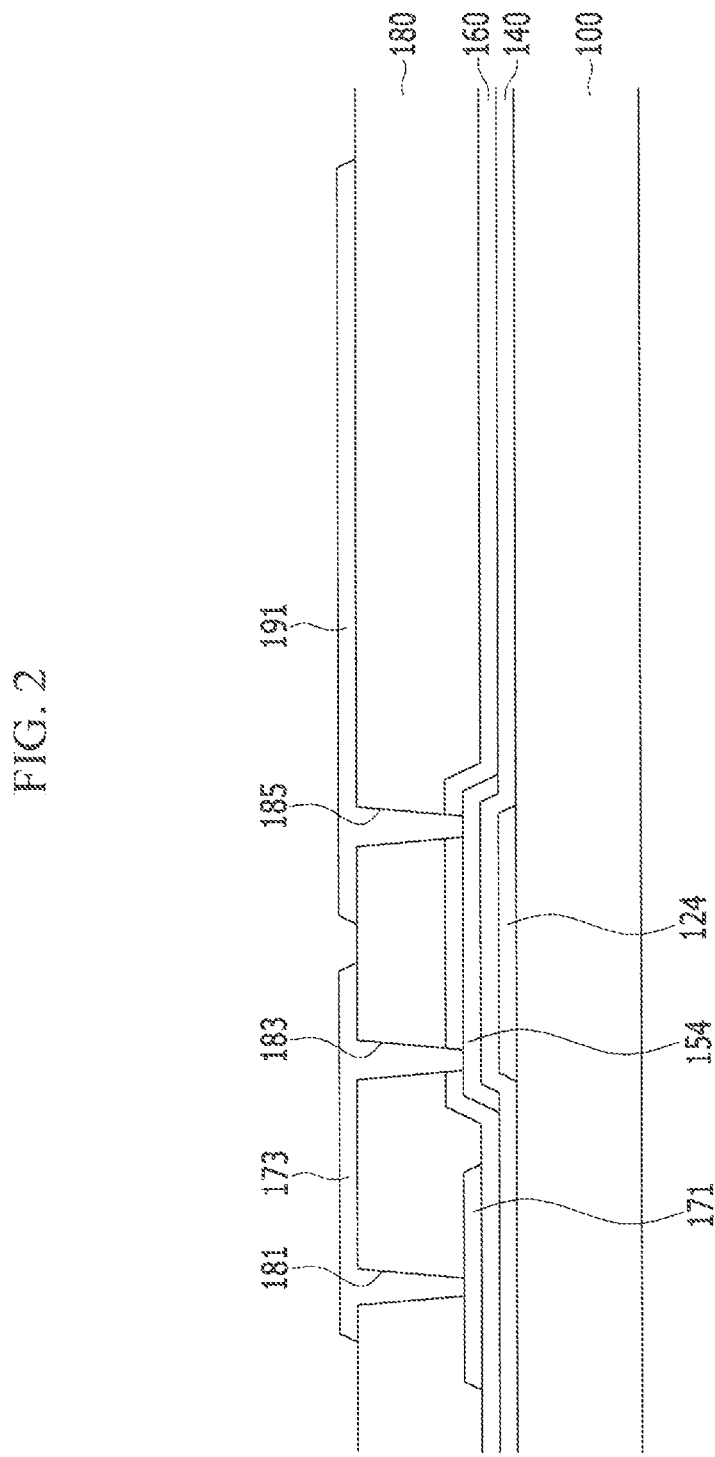
FIG. 2 is a cross-sectional view of FIG. 1, taken along the line II-II.

FIG. 1 is a layout view of a thin film transistor substrate according to an exemplary embodiment and FIG. 2 is a cross-sectional view of FIG. 1, taken along the line II-II.

As shown in FIG. 1, a plurality of gate lines 121 are formed on an insulation substrate 100 formed of transparent glass or plastic.

The gate lines 121 may transmit a gate signal and extend substantially along one dimension of the substrate, running parallel to each other. Each gate line 121 may include a plurality of gate electrodes 124 protruding from the gate line 121 and a wide end portion (not shown) for connection with another layer or an external driving circuit.

The gate line 121 may be made of a metal selected from an aluminum-based metal such as aluminum (Al) or aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), and titanium (Ti). However, the gate line 121 may have a multilayered structure including at least two conductive layers having different physical properties.

A gate insulating layer 140 is formed on the gate line 121.

The gate insulating layer 140 may include an insulation material such as silicon oxide (SiOx), silicon nitride (SiNx), or silicon oxynitride (SiON). The gate insulating layer 140 may be formed by using a sputtering method and the like.

A plurality of semiconductors 154 formed of oxide semiconductors may be formed on the gate insulating layer 140.

The oxide semiconductor may be formed of a material selected from an oxide of a metal selected from zinc (Zn), indium (In), gallium (Ga), tin (Sn) and titanium (Ti) and a combination of a metal such as zinc (Zn), indium (In), gallium (Ga), tin (Sn), titanium (Ti) and the like and an oxide thereof. For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

A first interlayer insulating layer 160 may be formed on the semiconductor 154. The first interlayer insulating layer 160 may be formed as a single layer or as multiple layers of insulating materials selected from silicon nitride and silicon oxide.

A plurality of data lines 171 may be formed on the first interlayer insulating layer 160 and the semiconductor 154.

The data lines 171 may transmit a data signal and may cross gate lines 121, extending substantially perpendicular to the gate lines 121. Each data line 171 may include a wide end portion (not shown) for connection with another layer or an external driving circuit.

The data lines 171 may be formed as a single layer or as multiple layers of a low-resistive metal such as copper, titanium, molybdenum, aluminum, and the like. In this case, the thickness of the data lines 171 may be more than 5,000 Å.

A second interlayer insulating layer 180 may be formed on the data line 171.

The second interlayer insulating layer 180 may be made of an inorganic insulator such as one of silicon nitride (SiNx) and silicon oxide (SiOx), an organic insulator, a low dielectric insulator, and the like. The organic insulator and the low dielectric insulator may be formed with a thickness sufficient to planarize the substrate.

A plurality of contact holes 183 and 185 may be formed in the first interlayer insulating layer 160 and the second interlayer insulating layer 180 to expose the semiconductor 154, and a contact hole 181 that exposes the data line 171 may be formed in the second interlayer insulating layer 180.

A source electrode 173 and a pixel electrode 191 may be formed on the second interlayer insulating layer 180.

The source electrode 173 may connect the data line 171 and a source portion of the semiconductor 154 through the contact holes 181 and 183.

In addition, the pixel electrode 191 may be connected with a drain portion of the semiconductor 154 through the contact hole 185, and may include a portion that faces the source electrode 173. The portion facing the source electrode 173 may become a drain electrode 175 of the transistor.

The pixel electrode 191 and the source electrode 173 may be formed of a transparent conductive material including at least one of ITO and IZO, and each may have a thickness of less than 500 Å.

One gate electrode 124, one source electrode 173, and one drain electrode may form one thin film transistor (TFT), and a channel of the thin film transistor may be formed in the semiconductor 154 between the source electrode 173 and the drain electrode 175.

An oxide semiconductor doped with an impurity may be disposed in an area where the source electrode 173, the drain electrode 175, and the semiconductor 154 contact each other.

In an exemplary embodiment, the source electrode 173 and the drain electrode 175 may be formed in the same layer with the same material of the pixel electrode 191 so that a process for forming a contact hole for connection of the drain electrode and pixel electrode may be omitted.

In addition, in an exemplary embodiment, a data line 171 may be formed of a thick low-resistive metal and a source electrode 173 and a drain electrode 175 may be formed of a transparent conductive material like that used for pixel electrode 191, the source electrode 173 and the drain electrode 175 being thinner than the data line 171 so that formation of undercut due to a skew occurring during wet-etching can be minimized. That is, as the thicknesses of the source electrode 173 and the drain electrode 175 are increased, the size of the undercut may increase due to skew during wet-etching, but, as in the exemplary embodiment, the size of the undercut due to the skew can be minimized by forming the source electrode and the drain electrode to be thinner than the data line.

Thus, when the source electrode and the drain electrode are reduced in size, the size of the thin film transistor does not need to be increased in proportion to the reduction in data line thickness caused by skew in etching, and thus the size of the transistor can be reduced while minimizing any corresponding decrease in the aperture ratio of the pixels of the display device.

In addition, in an exemplary embodiment, a data line may be formed of a low-resistive wire and both a source electrode and a drain electrode of a transistor may be formed of a transparent conductive material so that signal delay due to resistance in the data line does not occur.

The above-described thin film transistor substrate may be used as one of a lower substrate of a liquid crystal display (LCD) and a substrate of an organic light emitting diode (OLED) display.

Hereinafter, an OLED display including the thin film transistor substrate of FIG. 1 and FIG. 2 will be described in further detail with reference to FIGS. 3-6.

Figure 3:
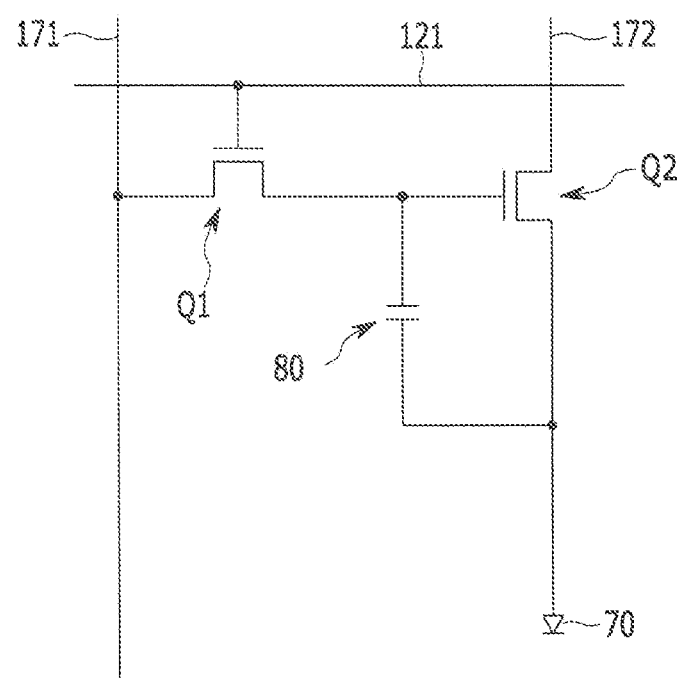
FIG. 3 is an equivalent circuit diagram of a pixel of an organic light emitting diode (OLED) display according to an exemplary embodiment.

FIG. 3 is an equivalent circuit diagram of a pixel of the OLED display according to an exemplary embodiment.

As shown in FIG. 3, a pixel according to the exemplary embodiment has a 2Tr-1Cap structure in which an organic light emitting diode 70, two thin film transistors, TFT's Q1 and Q2, and one capacitor 80 are included. However, the exemplary embodiment is not limited thereto. Thus, in another exemplary embodiment, one pixel of the OLED display 1001 may have a structure in which three or more thin film transistors and two or more capacitors are disposed, and various structures with additional wirings may be used. The additionally formed thin film transistor and the additional capacitor may form a compensation circuit.

A compensation circuit suppresses deviation in image quality by improving uniformity of the organic light emitting diodes 70 formed in each pixel. In general, the compensation circuit may include 2 to 8 thin film transistors.

The organic light emitting element 70 may include an anode which is a hole injection electrode, a cathode which is an electron injection electrode, and an organic emission layer disposed between the anode and the cathode.

Each pixel according to the exemplary embodiment may include a first thin film transistor Q1 and a second thin film transistor Q2.

The first thin film transistor Q1 and the second thin film transistor Q2 respectively include gate electrodes, semiconductors, source electrodes, and drain electrodes. In addition, a semiconductor of a thin film transistor of at least one of the first thin film transistor Q1 and the second thin film transistor Q2 may be formed of an oxide semiconductor. In addition, a source electrode and a drain electrode of at least one of the first thin film transistor and the second thin film transistor may include at least one transparent conductive material (e.g., ITO and IZO) and may be formed of the same material as the anode of the organic light emitting element.

The data line 171 may be connected with a source electrode of the first thin film transistor Q1, and a gate electrode of the first thin film transistor Q1 may be connected with the gate line 121. A drain electrode of the first thin film transistor Q1 may be connected with the capacitor 80. A node may be formed between the drain electrode of the first thin film transistor Q1 and the capacitor 80, and a gate electrode of the second thin film transistor Q2 may be connected to the node. A common power line 172 may be connected to a source electrode of the second thin film transistor Q2, and a drain electrode of the second thin film transistor Q2 may be connected with the anode of the organic light emitting element 70.

The first thin film transistor Q1 may be used as a switch to select a pixel for light emission.

In an exemplary embodiment, when the first thin film transistor Q1 is instantaneously turned on, the capacitor 80 is charged and the amount of charge stored in the capacitor at this point is proportional to a potential applied from the data line 171. In addition, when a voltage increasing signal is input for each frame cycle to a capacitor line (not shown) in the turn-off state of the first thin film transistor Q1, a gate potential of the second thin film transistor Q2 is increased along a voltage applied through the capacitor line. Here, the voltage has a level of a voltage applied with reference to the potential charged in the capacitor 80. The second thin film transistor Q2 is turned on when the gate potential exceeds a threshold voltage. Then, a voltage applied to the constant voltage line 172 is applied to the organic light emitting element 70 through the second thin film transistor Q2 such that the organic light emitting element 70 emits light.

Hereinafter, an OLED display according to an exemplary embodiment will be described in further detail with reference to FIGS. 4-6.

Figure 4:
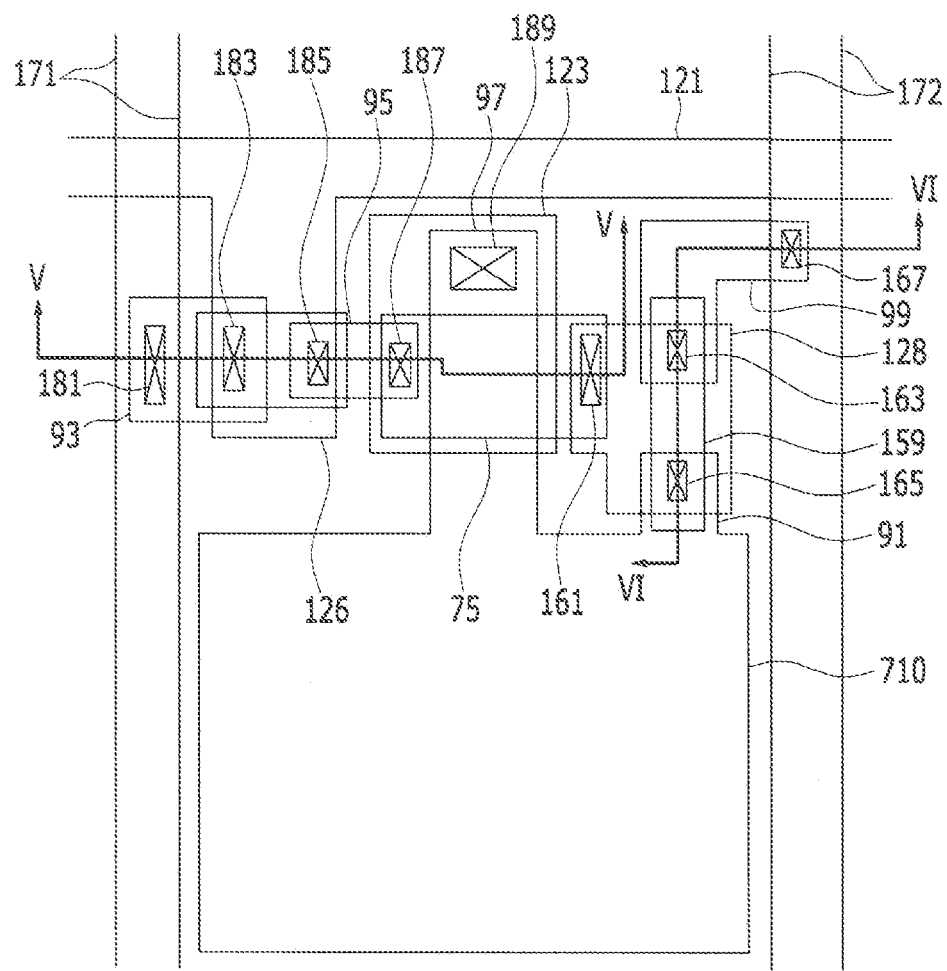
FIG. 4 is a layout view of a pixel of the OLED display of FIG. 3.
Figure 5:
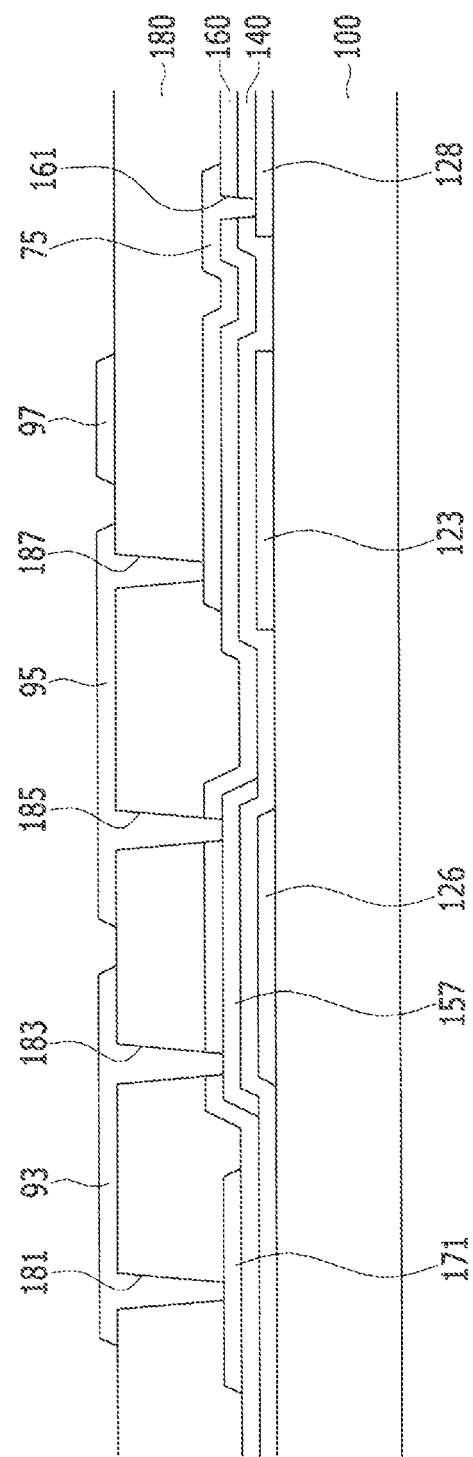
FIG. 5 is a cross-sectional view of FIG. 4, taken along the line V-V.
Figure 6:
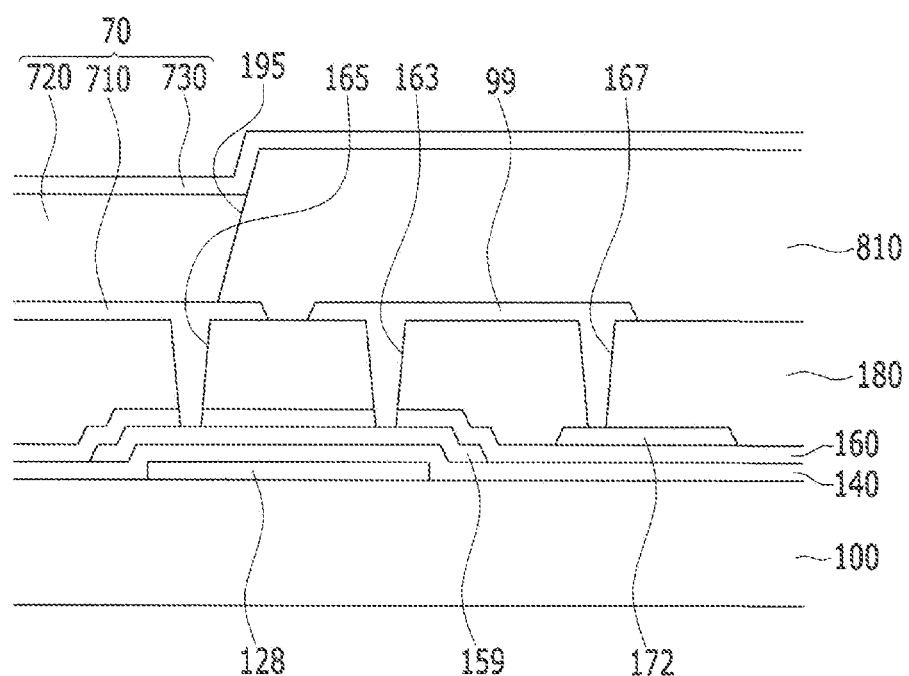
FIG. 6 is a cross-sectional view of FIG. 4, taken along the lie VI-VI.

FIG. 4 is a layout view of a pixel of the OLED display of FIG. 3, FIG. 5 is a cross-sectional view of FIG. 4, taken along the line V-V, and FIG. 6 is a cross-sectional view of FIG. 4, taken along the line VI-VI.

Referring to FIGS. 4-6, a gate line 121, a second gate electrode 128, and a first capacitor conductor 123 may be formed on a substrate 100.

The substrate 100 may be an insulating material formed of glass, quartz, ceramic, or plastic, or the substrate 100 may be a metallic substrate formed of stainless steel.

The gate line 121 includes a first gate electrode 126 protruding from the gate line. The gate line 121, the second gate electrode 128, and the first conductor 123 may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), and the like.

However, the gate line 121, the second gate electrode 128, and the first conductor 123 may have a multilayered structure including at least two conductive layers having different physical properties.

A gate insulating layer 140 is formed on the gate line 121, the second gate electrode 128, and the first conductor 123.

The gate insulating layer 140 may include an insulating material selected from silicon oxide (SiOx), silicon nitride (SiNx), and silicon oxynitride (SiON). The gate insulating layer 140 may be formed using sputtering.

A plurality of first and second semiconductors 157 and 159, formed of oxide semiconductors, may be formed on the gate insulating layer 140.

The oxide semiconductor may be a metal oxide semiconductor and may be made of a metal oxide such as zinc (Zn), indium (In), gallium (Ga), tin (Sn), titanium (Ti), and the like or a combination of a metal such as zinc (Zn), indium (In), gallium (Ga), tin (Sn), titanium (Ti), and the like and an oxide thereof. For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO).

A first interlayer insulating layer 160 may be formed on the semiconductors 157 and 159. The first interlayer insulating layer 160 may be made of one of silicon nitride (SiNx) and silicon oxide (SiO2) and may have a single-layered or multi-layered structure.

A plurality of data lines and a plurality of common power lines 172 may be formed on the first interlayer insulating layer 160 and the semiconductors 157 and 159.

The data line 171 may transmit a data signal and may extend in a direction crossing the gate line 121.

The common power line 172 may transmit a constant voltage and may extend in parallel with the data line 171 at a distance therefrom.

The data line 171 and the common power line 172 may be made of a low-resistive metal such as copper, titanium, molybdenum, aluminum, and the like, and may have a single-layered or multi-layered structure. The thickness of each of the data line 171 and the common power line 172 may be more than 5,000 Å.

A second interlayer insulating layer 180 may be formed on the data line 171 and the common power line 172.

The second interlayer insulating layer 180 may be made of an inorganic insulator such as one of silicon nitride and silicon oxide, an organic insulator, a low dielectric insulator, and the like. The organic insulator and the low dielectric insulator may be formed with a thickness suitable for planarizing the substrate.

A plurality of contact holes 183, 185, 163, and 165 may be formed in the first and second interlayer insulating layers 160 and 180 to expose the semiconductors 157 and 159, a plurality of contact holes 181, 167, and 187 may be formed in the second interlayer insulating layer 180 to expose the data line 171, the common power line 172, and the second conductor 75, and a contact hole 161 may be formed in the first interlayer insulating layer 160 and the gate insulating layer 140 to expose the second gate electrode 128.

A first source electrode 93, a first drain electrode 95, a third capacitor conductor 97, a second source electrode 99, a first drain electrode 91, and a first electrode 710 may be formed on the second interlayer insulating layer 180.

The first source electrode 93 may be connected with the data line 171 and a source portion of the first semiconductor 157 through the contact holes 181 and 183 to transmit a data signal transmitted from the data line 171 to the first drain electrode 95.

The first drain electrode 95 may be connected with a drain portion of the first semiconductor 157 and the second conductor 75 through the contact holes 185 and 187, and the second conductor 75 may be connected with the first drain electrode 95 and the second gate electrode 128 through the contact holes 187 and 161.

Thus, the signal transmitted to the first drain electrode 95 may be transmitted to the second gate electrode 128 through the second conductor 75.

In addition, the first conductor 123 and the third capacitor conductor 97 may be electrically connected with each other through the contact hole 189. Thus, the second conductor 75 may form a lower capacitor with the first conductor 123 using the gate insulating layer 140 and the first interlayer insulating layer 160 as a dielectric material, and may form an upper capacitor with the third capacitor conductor 97 using the second interlayer insulating layer 180 as a dielectric material. The lower capacitor and the upper capacitor may be connected in parallel to increase capacitance of the capacitor.

The second source electrode 99 may be connected with the common power line 172 and a source portion of the second semiconductor 159 through the contact holes 167 and 163 and may transmit a signal transmitted from the common power line to the second drain electrode 91.

The second drain electrode 91 may be connected with a drain portion of the second semiconductor through the contact hole 165. The second drain electrode 91 may be integrally formed with the first electrode 710 and may transmit a signal transmitted from the second drain electrode 91 to the first electrode 710. The first electrode 710 may become an anode of the organic light emitting element 70.

The first source electrode 93, the first drain electrode 95, the third capacitor conductor 97, the second source electrode 99, the second drain electrode 91, and the first electrode 710 may be made of a transparent conductive material including at least one of ITO and IZO, and the thickness of each may be less than 500 Å.

A pixel defining layer 810 may be formed on the first electrode 710 of the organic light emitting element 70.

The pixel defining layer 810 may include an opening 195 that exposes the first electrode 710. The pixel defining layer 810 may be formed by mixing a resin such as one of a polyacrylate and a polyimide with a silica-based inorganic substance.

An organic emission layer 720 may be formed in the opening 195 of the pixel defining layer 810.

The organic emission layer 720 may be formed as a multilayer structure including one or more of a light emission layer, a hole injection layer (HIL), a hole transport layer (HTL), an electron transport layer (ETL), and an electron injection layer (EIL).

If the organic emission layer 720 includes all of the aforementioned layers, the electron injection layer may be disposed on the first electrode 710, on which the electron transport layer, the organic emission layer, the hole transport layer, and the hole injection layer may then be sequentially stacked.

A second electrode 730 may be formed on the pixel defining layer 810 and the organic emission layer 720.

The second electrode 730 may become a cathode of the organic light emitting element 70. Thus, the first electrode 710, the organic emission layer 720, and the second electrode 730 may form the organic light emitting element 70.

The second electrode 730 may be formed of one of a reflective layer, a transparent layer, and a semi-transparent layer.

The reflective layer and semi-transparent layer may be formed of at least one of magnesium (Mg), silver (Ag), gold (Au), calcium (Ca), lithium (Li), chromium (Cr), aluminum (Al) and an alloy thereof. The reflective and semi-transparent properties of those respective layers may be determined by the thickness to which the layers are formed, and the semi-transparent layer may have a thickness of less than or equal to 200 nm. Light transmittance is increased as the layer thickness is decreased, but resistance is increased when the thickness is too thin.

The transparent layer may be formed of a material selected from indium tin oxide (ITO), indium zinc oxide (IZO) and zinc oxide (ZnO).

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An organic light emitting diode (OLED) display comprising:
   a substrate;
   a first signal line including a first gate electrode disposed directly on the substrate;
   second and third signal lines crossing the first signal line, the second signal line being a data line to which a data signal is applied and the third signal line being a common power line to which a constant voltage is applied;
   a first transistor having the first gate electrode connected with the first signal line and having a source electrode connected with the second signal line;
   a second transistor having a second gate electrode connected with a drain electrode of the first transistor and having a source electrode connected with the third signal line; and
   an organic light emitting element having a pixel electrode connected with the drain electrode of the second transistor,
   the source electrodes and the drain electrodes of at least one of the first and second transistors and the pixel electrode of the organic light emitting element connected with the second transistor being formed on a second interlayer insulating layer with a same material, wherein the source electrodes, the drain electrodes, and the pixel electrode are thinner than the data line, and the source electrodes and the drain electrodes of the first and second transistors being thinner than the third signal line.

2. The OLED display of claim 1, the material being a transparent conductive material.

3. The OLED display of claim 2, the transparent conductive material including at least one of ITO and IZO.

4. The OLED display of claim 1, the source electrode of the first transistor being connected with the second signal line through a first contact hole through the second interlayer insulating layer, and the source electrode of the second transistor being connected with the third signal line through a second contact hole through the second interlayer insulating layer.

5. The OLED display of claim 1, further comprising a capacitor formed of:
   a first capacitor conductor disposed directly on the substrate;
   a gate insulating layer disposed directly on the first capacitor conductor;
   a first interlayer insulating layer disposed directly on the gate insulating layer;
   a second capacitor conductor disposed directly on the first interlayer insulating layer;
   the second interlayer insulating layer being disposed directly on the second capacitor conductor; and
   a third capacitor conductor disposed directly on the second interlayer insulating layer.

6. The OLED display of claim 5, the first capacitor conductor being formed of a same material as the first signal line, the second capacitor conductor being formed of a same material as the second and third signal lines, and the third capacitor conductor being formed of a same material as the pixel electrode.

7. The OLED display of claim 6, the first capacitor conductor being electrically connected with the third capacitor conductor through a third contact hole formed in the gate insulating layer, the first interlayer insulating layer, and the second interlayer insulating layer.

* * * * *